US012675044B2

(12) United States Patent
Ermert et al.

(10) Patent No.: US 12,675,044 B2
(45) Date of Patent: Jul. 7, 2026

(54) TIN(II) AMIDE/ALKOXIDE PRECURSORS FOR EUV-PATTERNABLE FILMS

(71) Applicant: ENTEGRIS, INC., Billerica, MA (US)

(72) Inventors: David M. Ermert, Danbury, CT (US); Tom M. Cameron, Newtown, CT (US)

(73) Assignee: Entegris, Inc., Billerica, MA (US)

( * ) Notice: Subject to any disclaimer, the term of this patent is extended or adjusted under 35 U.S.C. 154(b) by 758 days.

(21) Appl. No.: 17/899,156

(22) Filed: Aug. 30, 2022

(65) Prior Publication Data

US 2023/0126125 A1 Apr. 27, 2023

Related U.S. Application Data

(60) Provisional application No. 63/239,648, filed on Sep. 1, 2021.

(51) Int. Cl.
*G03F 7/004* (2006.01)
*G03F 7/20* (2006.01)

(52) U.S. Cl.
CPC .......... *G03F 7/0042* (2013.01); *G03F 7/2004* (2013.01)

(58) Field of Classification Search
CPC ..... C07F 7/2224; C07F 7/2284; G03F 7/0042
See application file for complete search history.

(56) References Cited

U.S. PATENT DOCUMENTS 6,307,078 B1 10/2001 Boyle
10,446,389 B2 10/2019 Cooper
2018/0308687 A1 10/2018 Smith
2019/0315781 A1* 10/2019 Edson .................. C07F 7/2224
2020/0168466 A1 5/2020 Shankar
2021/0013034 A1 1/2021 Wu
(Continued)

FOREIGN PATENT DOCUMENTS

CN 101538277 A * 9/2009 ............ C07F 7/2204
KR 20210044608 A * 4/2021 ............ C07F 7/2224
(Continued)

OTHER PUBLICATIONS

Wang et al, Kinetic Analysis of the Living Ring-Opening Polymerisation of L-Lactide with Tin(II) Initiators, European Journal of Inorganic Chemistry, 5808-5927 (2013). (Year: 2013).*
(Continued)

*Primary Examiner* — Amanda C. Walke

(57) ABSTRACT

The invention provides certain mixed Sn (II) amide/alkoxide precursor compounds. These compounds are useful in precursor compositions in the vapor deposition of tin-containing films such as tin oxide films onto a surface of a microelectronic device. These precursor compounds are useful in, for example, extreme ultraviolet light (EUV) lithography techniques used in microelectronic device manufacturing when paired with certain counter-reactants in a vapor deposition process. In this process, the resulting organotin polymeric surface is thus EUV-patternable insofar as when exposed to a patterned beam of EUV light, exposed portions are subjected to further reaction, thus creating regions which are chemically and physically different; this difference enables further processing and lithography of exposed regions and/or non-exposed regions and lithography in pursuit of the ultimate fabricated microelectronic device.

10 Claims, 1 Drawing Sheet

(56) References Cited

U.S. PATENT DOCUMENTS

| | | | | |
|---|---|---|---|---|
| 2021/0013934 | A1 | 1/2021 | Cole-Rhodes | |
| 2022/0356576 | A1* | 11/2022 | Parish | C23C 16/306 |

FOREIGN PATENT DOCUMENTS

| | | | | |
|---|---|---|---|---|
| WO | 2014131750 | A1 | 9/2014 | |
| WO | 2021029215 | A1 | 2/2021 | |
| WO | 2021058986 | A1 | 4/2021 | |
| WO | WO-2021075397 | A1 * | 4/2021 | C23C 16/18 |

OTHER PUBLICATIONS

Soulantica et al., Selective Synthesis of Novel In and In3Sn Nanowires by an Organometallic Route at Room Temperature, Angewandte Chemie, International Edition, vol. 40, No. 16, pp. 2983-2986, 2001.

Boyle et al., Hydrolysis of Tin(II) Neo-pentoxide: Syntheses, Characterization, and X-ray Structures of [Sn(ONep)2]∞, Sn5(μ3-O)2(μ-ONep)6, and Sn6(μ3-O)4(μ-ONep)4 Where ONep = OCH2CMe3, Inorganic Chemistry, vol. 41, No. 9, pp. 2574-2582, 2002.

Berends et al., LSn(OCH2CH2)2NR (L = lone pair, W(CO)5; R = Me, t-Bu). The Molecular Structures of 5-Aza-2,8-dioxa-1-stannabicyclo[3.3.0]1.5octanes and Their Tungstenpentacarbonyl Complexes, Z. anorg. allg. Chem., 635: 369-374, https://doi.org/10.1002/zaac.200800434.

Muller et al., Influence of Precursor Chemistry on Morphology and Composition of CVD-Grown SnO2 Nanowires, Chemistry of Materials, vol. 24, No. 21, pp. 4028-4035, 2012.

Olmstead et al., Structural Studies of Tin(II) and Lead(II) Dimethylamides: X-ray Crystal Structure of [Sn(NMe2)2] 2 and Isolation of Its Lead Analogue, Inorganic Chemistry, vol. 23, No. 4, pp. 413-415, 1984.

Veith et al., A novel precursor system and its application to produce tin doped indium oxide, Dalton Transactions, vol. 40, No. 22, pp. 6028-6032, 2011.

T. Boyle et al., Tin(II) amide/alkoxide coordination compounds for production of Sn-based nanowires for lithium ion battery anode materials, 2012, 41, 9349-9364.

C. Nayral et al., A Novel Mechanism for the Synthesis of Tin / Tin Oxide Nanoparticles of Low Size Dispersion and of Nanostructured SnO2for the Sensitive Layers of Gas Sensors, Wiley-VCH Verlag GmbH, D-69469 Weinheim, 1999, pp. 0935-9648.

Lam Research, Lam Research Unveils Technology Breakthrough for EUV Lithography, Feb. 26, 2020, Fremont, California.

T. Manouras et al., High Sensitivity Resists for EUV Lithography: A Review of Material Design Strategies and Performance Results, 2020, pp. 1-24.

Wang et al., Structure vs 119 Sn NMR Chemical Shift in Three-Coordinated Tin(II) Complexes: Experimental Data and Predictive DFT Computations, 2015, 34, pp. 2139-2150.

* cited by examiner

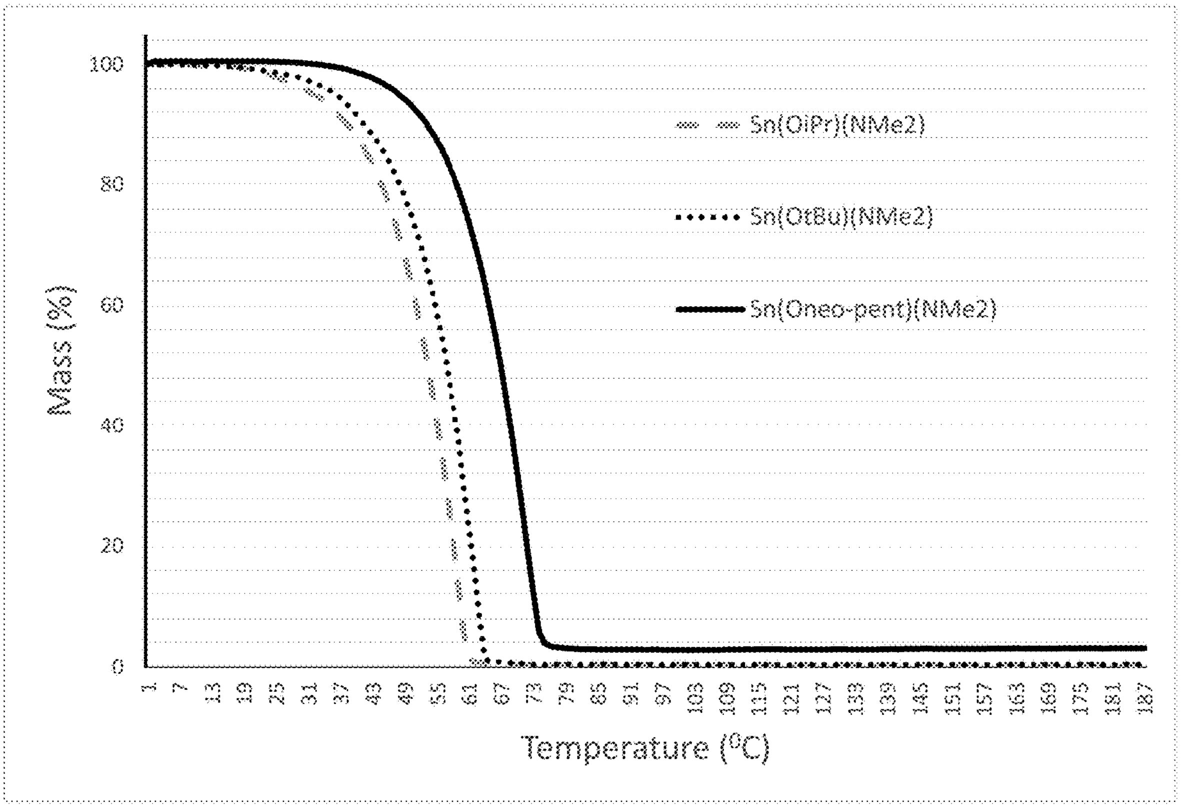
Mass (%)
100
80
60
40
20
0
Sn(OiPr)(NMe2)
Sn(OtBu)(NMe2)
Sn(Oneo-pent)(NMe2)
1 7 13 19 25 31 37 43 49 55 61 67 73 79 85 91 97 103 109 115 121 127 133 139 145 151 157 163 169 175 181 187
Temperature (⁰C)

TIN(II) AMIDE/ALKOXIDE PRECURSORS FOR EUV-PATTERNABLE FILMS

PRIORITY CLAIM

This disclosure claims priority to U.S. Provisional Patent No. 63/239,648, filed on Sep. 1, 2021 and incorporated by reference into the present disclosure.

FIELD OF THE INVENTION

This invention belongs to the field of organotin chemistry. In particular, it relates to certain Sn (II) vapor deposition precursor compounds and methods for their synthesis.

BACKGROUND OF THE INVENTION

Certain organometallic compounds have been shown to be useful as precursors in the deposition of highly pure metal oxide films in applications such as extreme ultraviolet (EUV) lithography techniques used in the manufacture of microelectronic devices. In this process, certain organometallic precursors are utilized in conjunction with counter-reactants to form a polymerized organometallic film. A pattern is then formed on the surface, exposing the EUV-patternable film involving exposure of the film using a patterned beam of EUV light, followed by exposing the resulting microelectronic device surface to a post exposure bake in ambient air. This treatment with patterned EUV light leaves some exposed portions of the surface and some non-exposed portions, thus enabling further manipulation and patterning due to the different physical and chemical differences in the two regions. See, for example, U.S. Patent Publication 2021/0013034.

Thus, a need exists for further development of precursor composition and counter-reactant pairings which can be used in this dry (photo)resist process

SUMMARY

In summary, the invention provides certain Sn (II) amide, Sn (II) alkoxide, and mixed Sn (II) amide/alkoxide precursor compounds. These compounds are useful in precursor compositions in the vapor deposition of tin-containing films such as tin oxide films onto a surface of a microelectronic device substrate. Additionally, the precursor compounds of the invention are useful in, for example, extreme ultraviolet light (EUV) lithography techniques used in microelectronic device manufacturing when paired with certain co-reactants in a vapor deposition process. In this process, the resulting organotin polymeric surface is thus EUV-patternable insofar as when exposed to a patterned beam of EUV light, exposed portions are subjected to further reaction, thus creating regions which are chemically and physically different; this difference enables further processing and lithography of exposed regions and/or non-exposed regions and lithography in pursuit of the ultimate fabricated microelectronic device.

BRIEF DESCRIPTION OF THE DRAWING

FIG. 1 is an STA-DSC plot (Simultaneous Thermal Analysis-Differential Scanning calorimetry) of the compounds $Sn(O\text{-t-butyl})(N(CH_3)_2)$, $Sn(O\text{-isopropyl})(N(CH_3)_2)$, $Sn(O\text{-neopentyl})(N(CH_3)_2)$, and $[Sn(N(CH_3)_2)_2]_2$.

DETAILED DESCRIPTION OF THE INVENTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant FIGURE.

Numerical ranges expressed using endpoints include all numbers subsumed within that range (e.g., 1 to 5 includes 1, 1.5, 2, 2.75, 3, 3.80, 4 and 5).

In one aspect, the invention provides a precursor composition comprising at least one compound chosen from Formulae (I), (II), and (III):

(I)

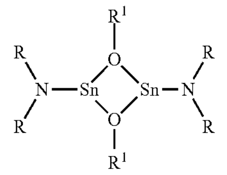

(II)

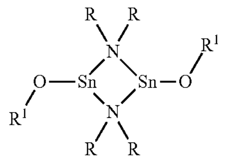

$[R^1OSn(NR_2)]_n$ (III)

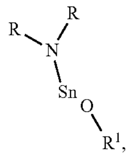

$Sn(OR^1)(NR_2)$ wherein R is $C_1$-$C_4$ alkyl, and $R^1$ is $C_1$-$C_5$ alkyl. In one embodiment the composition contains no more than 100 ppm of materials which are other than compounds of Formulae (I), (II), and (III).

In the above Formulae, $R^1$ is chosen from groups such as methyl, ethyl, propyl, isopropyl, n-butyl, tert-butyl, and neopentyl. In one embodiment, each R is methyl and each $R^1$ is isopropyl. In one embodiment, each R is methyl and each $R^1$ is tert-butyl. In one embodiment, each R is methyl and each $R^1$ is isopropyl. In another embodiment, each R is methyl and each $R^1$ is neopentyl. In certain embodiments, the precursor compositions are highly pure and thus contain no more than 50, or 10, or 1 ppm of materials other than the stated compounds of Formulae (I), (II), and (III). In certain embodiments, the materials which are other than the stated compounds are silicon-containing materials.

In another aspect, the compounds of Formulae (I), (II), and (III) are be prepared in one step via the reaction of a compound of the formula:

(A)

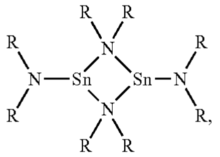

wherein each R is $C_1$-$C_4$ alkyl, with an alcohol of the formula $HOR^1$, wherein $R^1$ is $C_1$-$C_5$ alkyl. In this reaction, non-polar aprotic solvents such as hexanes may be utilized. See Scheme 1 below:

Scheme 1

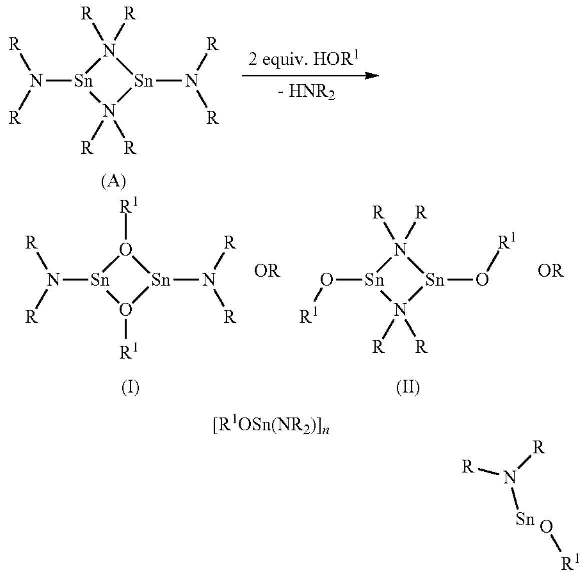

(A)

OR

OR (I)

(II)

$[R^1OSn(NR_2)]_n$ (III)

$Sn(OR^1)(NR_2)$

This synthetic methodology yields a product which is comprised of compounds of Formula (I) and/or (II), and/or (III), either alone, as a mixture, or as a mixture with each compound in a dynamic equilibrium with the other. These organotin precursor compounds are in either liquid or solid form and possess sufficient volatility to be useful in various vapor deposition processes when the deposition of a tin-containing film onto a surface of a microelectronic device is desired.

The starting material of Formula (A), as described above, can be prepared in a highly pure form using the following methodology. The compounds of Formula (A) were found to be light sensitive, with decomposition by-products in gaseous form. In general, $SnCl_2$ is dissolved in a polar aprotic solvent such as tetrahydrofuran, cooled to a temperature of about 15° C. and then treated with a portion of the stoichiometric amount of solid $LiN(R)_2$ (e.g., $LiN(CH_3)_2$ where R is methyl). The slightly exothermic reaction is then cooled back down to about 15° C. and then additional portions are added and the cycle is repeated until complete. The resulting reaction mixture is then evaporated in vacuo and the resulting solid washed with a non-polar solvent such as hexanes. Recrystallization from hexanes generally results in a purity of at least about 99.0%, or at least about 99.7%. (In other words, less than about 1 weight percent impurities.) This order of addition and solvent choice was found to be critical; if, however, the $SnCl_2$ is added to the $LiN(CH_3)_2$ in a non-polar solvent such as hexanes, then the compound $LiSn(N(CH_3)_2)_3$ is isolated as the major product instead of the desired $[Sn(N(CH_3)_2)_2]_2$ compound.

Using this methodology, the compounds of Formula (A) can be prepared, either with or without subsequent purification and thus provide a material having less than about 1 weight percent, less than about 0.5 weight percent, or less than about 0.1 weight percent of impurities which are other than compounds of Formula (A). This level of purity is believed to contribute to the compounds of Formula (A) capable of being used directly as liquid precursors in the vapor deposition of tin-containing films onto microelectronic device substrates. Accordingly, in a third aspect, the invention provides a process for the deposition of a tin-containing film onto a surface of a microelectronic device in a reaction zone, which comprises introducing into the reaction zone, a precursor composition comprising at least one compound of Formula (A), to said surface in a reaction zone under vapor deposition conditions.

In the above aspect, as noted above in Scheme 1, the reagent of the formula $HOR^1$ is utilized in an amount of roughly two molar equivalents (e.g., about 1.8 to about 2.2 molar equivalents), based on the moles of starting material of Formula (A).

In another aspect, the invention provides the process of the second aspect, wherein the reagent of the formula HOR' is utilized in an amount of roughly four molar equivalents (for example, from about 3.6 to about 4.4, or about 3.8 to about 4.2 or about 3.9 to about 4.1 molar equivalents), based on the moles of starting material of Formula (A), to provide the compounds of Formulae (IV), (V), and (VI). This reaction proceeds as depicted in Scheme II below:

Scheme II.

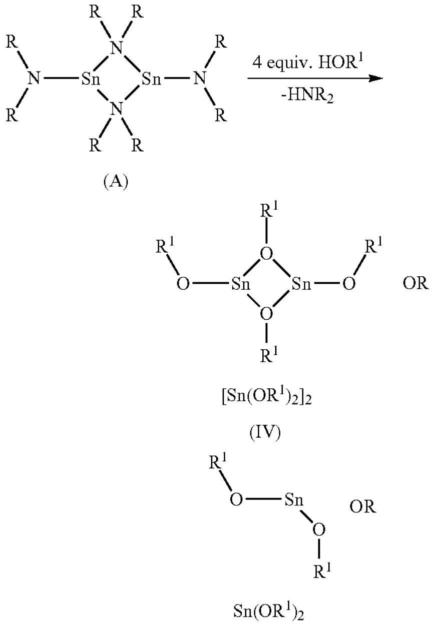

(A)

OR $[Sn(OR^1)_2]_2$ (IV)

OR $Sn(OR^1)_2$ (V)

-continued

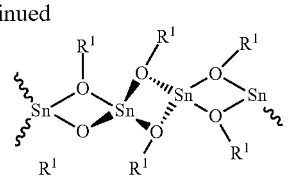

$[Sn(OR^1)_2]_\infty$ (VI)

In Scheme II, R is $C_1$-$C_4$ alkyl and $R^1$ is $C_1$-$C_5$ alkyl. In another aspect, the invention provides a precursor composition comprising at least one compound chosen from Formulae (IV), (V), and (VI), wherein the composition contains no more than 100 ppm of materials which are other than compounds of Formulae (IV), (V), and (VI). In certain embodiments, the precursor compositions are highly pure and thus contain no more than 50, or 10, or 1 ppm of materials other than the stated compounds of Formulae (IV), (V), and (VI). In certain embodiments the materials which are other than the stated compounds are silicon-containing compounds.

The compounds of the Formulae (IV), (V), and (VI) are useful as precursors as with compounds (I), (II), and (III) referred to above. As with compounds (I), (II), and (III), this synthetic methodology yields a product which is comprised of compounds of Formula (IV) and/or (V), and/or (VI), either alone, as a mixture, or as a mixture with each compound in a dynamic equilibrium with the other.

In another aspect, a compound of the formula $SnX_2$, wherein X is chosen from chloro, bromo, or iodo, is reacted with approximately one molar equivalent of a compound of the formula $MOR^1$ (for example, about 0.8 to about 1.2, or about 0.9 to about 2.1 molar equivalents) and approximately one molar equivalent (for example, about 0.8 to about 1.2, or about 0.9 to about 2.1 molar equivalent) of a compound of the formula $MN(R)_2$, wherein M is chosen from groups I and II of the periodic table, to afford compounds of the formulae (I), (II), and (III), according to scheme III:

SCHEME III.

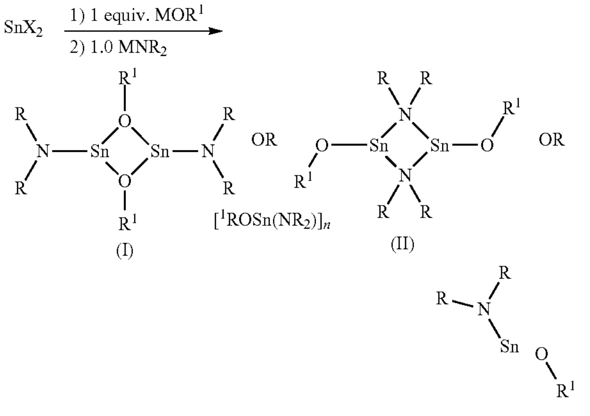

(I) $[^1ROSn(NR_2)]_n$ (II)

$Sn(OR^1)(NR_2)$ (III)

In one embodiment, M is chosen from lithium, sodium, potassium, and magnesium. In Scheme III R is $C_1$-$C_4$ alkyl and $R^1$ is $C_1$-$C_5$ alkyl.

In another aspect, a compound of the formula $SnX_2$, wherein X is chosen from chloro, bromo, or iodo, is reacted with approximately two molar equivalents (for example, about 1.8 to about 2.2, or about 1.9 to about 2.1 molar equivalents) of a compound of the formula $MOR^1$, wherein M is chosen groups I and II of the periodic table, to provide compounds of the formulae (IV), (V), and (VI), as depicted in Scheme IV below:

SCHEME IV.

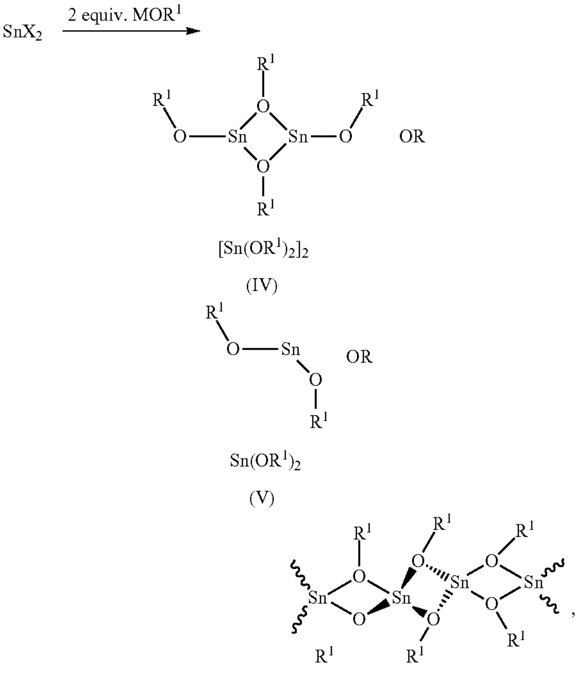

$[Sn(OR^1)_2]_2$ (IV)

$Sn(OR^1)_2$ (V)

$[Sn(OR^1)_2]_\infty$ (VI)

In one embodiment, M is chosen from lithium, sodium, potassium, and magnesium. In Scheme IV R is $C_1$-$C_4$ alkyl and $R^1$ is $C_1$-$C_5$ alkyl.

In another aspect, the invention provides compounds of the formulae (IV), (V), and (VI), which are believed to be useful as precursors as described with respect to compounds (I), (II), and (III).

As noted above, the compounds of the invention are believed to be particularly useful in the patterning of microelectronic device substrates using extreme ultraviolet light (EUV) techniques. In this regard, see U.S. Patent Publication 2021/0013034, incorporated herein by reference. It is contemplated that the precursor compositions of the invention, in the form of a vapor stream, are mixed with a counter-reactant in a manner which forms an organometallic material in an oligomeric or polymeric form on a microelectronic device surface, such as a silicon wafer. In this fashion, the film so formed becomes an EUV-patternable film, given its reactivity with EUV light.

Accordingly, in another aspect, the invention provides a process for depositing an EUV-patternable film onto a surface of a microelectronic device in a reaction zone, a precursor composition comprising reactants chosen from:

a. a precursor composition chosen from at least one compound of the Formulae (I) through (VI) and (A); and b. at least one counter-reactant chosen from compounds capable of reacting with reacting with —O—$R^1$ and —$N(R)_2$ moieties, wherein $R^1$ is chosen from $C_1$-$C_5$ alkyl, and R is $C_1$-$C_4$ alkyl,
under vapor deposition conditions.

As stated, suitable counter-reactant(s) are those compounds which are capable of replacing the —O—$R^1$ and/or —$N(R)_2$ groups on the compounds of Formulae (I) through (VI) and (A) as set forth above, and include materials such as water, peroxides such as hydrogen peroxide, di- or polyhydroxy alcohols, hydrogen sulfide, hydrogen disulfide, trifluoroacetaldehyde monohydrate, fluorinated di- or polyhydroxy alcohols, and fluorinated glycols.

The thin films thus formed are oligomeric or polymeric organometallic materials comprising $SnO_x$, wherein x is about 0.1 to about 2. Additionally, these EUV-patternable thin films generally vary from about 0.5 to about 100 nm in thickness In certain embodiments, vapor deposition conditions comprise reaction conditions known as chemical vapor deposition, pulsed-chemical vapor deposition, and atomic layer deposition. In the case of pulsed-chemical vapor deposition, a series of alternating pulses of the precursor composition and counter-reactant(s), either with or without an intermediate (inert gas) purge step, can be utilized to build up the film thickness to a desired endpoint.

In certain embodiments, the pulse time (i.e., duration of precursor exposure to the substrate) for the precursor compounds depicted above ranges between about 1 and 30 seconds. When a purge step is utilized, the duration is from about 1 to 20 seconds or 1 to 30 seconds. In other embodiments, the pulse time for the co-reactant ranges from 5 to 60 seconds.

In one embodiment, the vapor deposition conditions comprise a temperature in the reaction zone of about 0° C. to about 250° C., or about 22° C. to about 150° C., and at a reduced pressure of about 10 mTorr to about 10 Torr.

The precursor composition comprising the compounds chosen from at least one of formulae (I) through (VI) and (A) above, can be employed for forming (a) tin-containing films and (b) high-purity EUV-patternable films, when used in conjunction with the counter-reactant materials referred to above. In the eighth and ninth aspects, any suitable vapor deposition technique, such as chemical vapor deposition (CVD), digital (pulsed) CVD, atomic layer deposition (ALD), or a flowable chemical vapor deposition (FCVD) can be utilized.

In the tenth aspect of the invention, the compounds above may be reacted with the counter-reactant(s) and the surface of the desired microelectronic device substrate in a reaction zone in any suitable manner, for example, in a single wafer CVD or ALD, or in a furnace containing multiple wafers.

Alternatively, the processes of the invention can be conducted as an ALD or ALD-like process. As used herein, the terms "ALD or ALD-like" refer to processes such as (i) each reactant including the precursor composition comprising the compounds chosen from Formulae (I) through (VI) and (in the case of the ninth aspect), the counter-reactant(s) are introduced sequentially into a reactor such as a single wafer ALD reactor, semi-batch ALD reactor, or batch furnace ALD reactor, or (ii) each reactant is exposed to the substrate or microelectronic device surface by moving or rotating the substrate to different sections of the reactor and each section is separated by an inert gas curtain, i.e., spatial ALD reactor or roll to roll ALD reactor.

The deposition methods disclosed herein may involve one or more purge gases. The purge gas, which is used to purge away unconsumed reactants and/or reaction by-products, is an inert gas that does not react with either the precursor composition or the counter-reactant(s). Exemplary purge gases include, but are not limited to, argon, nitrogen, helium, neon, and mixtures thereof. In certain embodiments, a purge gas such as Ar is supplied into the reactor at a flow rate ranging from about 10 to about 2000 sccm for about 0.1 to 1000 seconds, thereby purging the unreacted material and any by-product that may remain in the reactor. Such purge gasses may also be utilized as inert carrier gasses for either or both of the precursor composition and counter-reactant(s).

The respective step of supplying the precursor composition and the counter-reactant(s), may be performed by changing the sequences for supplying them and/or changing the stoichiometric composition of the resulting EUV-patternable film.

Energy is applied to the precursor composition and the co-reactant(s) in the reaction zone to induce reaction and to form the EUV-patternable film on the microelectronic device surface. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate, such as a silicon wafer, that will eventually become a microelectronic device or microelectronic assembly. Such microelectronic devices contain at least one substrate, which can be chosen from, for example, tin, $SiO_2$, $Si_3N_4$, OSG, FSG, tin carbide, hydrogenated tin carbide, tin nitride, hydrogenated tin nitride, tin carbonitride, hydrogenated tin carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. Thus, in an eleventh aspect, the invention provides a microelectronic device substrate having an EUV-patternable film deposited thereon by the methodology described herein.

Another aspect relates to a kit including, in one or more containers, one or more components adapted for use in the deposition of an EUV-patternable film of the invention. The containers of the kit must be suitable for storing and shipping said compositions, and advantageously include means for bringing the components in the one or more containers into the reaction zone where the deposition of the EUV-patternable film is formed on the microelectronic device substrate. In addition, the container(s) and system may include a dispensing port for dispensing the composition(s) to a process tool.

Accordingly, in a further aspect, the invention comprises a kit, comprising in one or more containers, one or more components chosen from:

a. a precursor composition comprising at least one compound of the formulae (I) through (VI) or (A), as set forth herein; and b. at least one counter-reactant chosen from compounds capable of reacting with —O—$R^1$ and —$N(R)_2$ moieties, wherein $R^1$ is chosen from $C_1$-$C_5$ alkyl, and R is $C_1$-$C_4$ alkyl.

In certain embodiments, the counter-reactant is chosen from water, peroxides, di- or polyhydroxy alcohols, hydrogen sulfide, hydrogen disulfide, trifluoroacetaldehyde monohydrate, fluorinated di- or polyhydroxy alcohols, and fluorinated glycols.

EXAMPLES

Example 1 Synthesis of $[Sn(NMe_2)_2]_2$ (Note: Care must be taken when handling $[Sn(N(CH_3)_2)_2]_2$ as it is light-sensitive. Photochemical decomposition results in generation of tin metal and gaseous byproducts that may build pressure and result in an energetic mixture.)

In a nitrogen-filled glovebox operated in the absence of ambient light, $SnCl_2$ (60 g, 313 mmol) was loaded into a 1 L 3-neck jacketed flask equipped with an addition funnel, stirring paddle, and thermocouple. The $SnCl_2$ was then dissolved in tetrahydrofuran (500 mL), whereby a slight exotherm was observed (31° C.). The jacketed flask was covered with aluminum foil and cooled to 15° C. and solid $LiN(CH_3)_2$ (5 g) added over ten minutes. During this time the pot temperature rose from 15.1° C. to 24.4° C. The reaction was then allowed to cool back down to 15° C. before the following 5 g allotment of $LiNMe_2$ was added. The repeated addition of $LiNMe_2$ in 5 g increments over ten minutes' time and cooling cycles were continued until all the $LiNMe_2$ (32.7 g, 641 mmol) had been added. After addition of the final $LiNMe_2$ installment the cooling of the jacketed flask was stopped once the exotherm had ceased, and the reaction stirred at room temperature for 30 minutes. At this point the reaction presented as a dark grey mixture and was filtered through a disposable polyethylene filter frit. The resulting dark brown solution was dried under reduced pressure with heating (35° C.) to yield a gray solid which was washed with hexanes (100 ml) and re-dried using the same conditions. The resulting free-flowing gray powder was extracted with hexanes (250 mL) at 65° C., filtered over a disposable polyethylene frit, the filter cake washed with hexanes (50 mL), and the combined organic layers dried under reduced pressure to yield the product as a free-flowing pale-yellow powder. Yield: 60.77 g, 93.8%. The product was dissolved in hexanes (125 mL) at 65° C. recrystallized by cooling in the freezer at −35° C. the mother liquor decanted away, and the product dried under reduced pressure to yield 56.3 g (yield: 86.9%) of crystalline $[Sn(NMe_2)_2]_2$ in a purity of 99.79%. $^{1}$H-NMR ($C_6D_6$, 400 MHz); d, 24H, 2.80 ppm; $^{13}$C-NMR ($C_6D_6$, 100 MHz); 44.38 ppm; $^{119}$Sn-NMR ($C_6D_6$, 150 MHz); 123.80 ppm. ("Me"=methyl)

Example 2 Synthesis of $LiSn(NMe_2)_3$

In a nitrogen-filled glovebox a 2 L 3-neck half-jacketed flask was equipped with an overhead paddle stirrer, gas inlet adapter, and wide-mouth funnel. The flask was cooled to 2° C. using an external chiller filled with silicon oil. N-butyllithium (1.6M in hexanes, 1 L, 1.6 moles) was measured out using a volumetric flask and added to the cooled 3-neck flask with stirring. The solution was cooled for 15 minutes and the wide-mouth funnel replaced with a condenser. A gas cylinder containing dimethylamine was outfitted with ¼" PTFE tubing, connected to the 3-neck flask via the gas inlet adapter, and tared on a balance. The gas inlet tube was placed 1" below the nBuLi solution and the dimethylamine gas added to the stirred solution at a rate of 0.55 g/min. As the dimethylamine was added the reaction mixture became slightly cloudy and increasing amounts of white precipitate were observed. After 78 g (1.70 moles) of dimethylamine had been consumed the gas addition was suspended, the reaction diluted with hexanes (400 mL), and the gas inlet adapter replaced with a thermocouple. The flask condenser was replaced with an addition funnel and $SnCl_2$ added in 50 g aliquots in 1 hour increments, where the temperature slowly rose from 24.7° C. to 25.9° C. over the course of 3 hours. Upon complete addition of $SnCl_2$ (153 g, 0.81 moles) the reaction was stirred at 50° C. overnight.

The following morning the reaction presented as a brown/grey mixture, was filtered hot through a disposable 2 L polyethylene filter frit into a 2 L 4-neck flask equipped with a magnetic stir bar, the flask and filter cake washed with additional hexanes (100 mL), and the combined flaxen solutions dried under reduced pressure with heating to yield $[Sn(NMe_2)_2]_2$ (60.19 g, 0.14 moles) as a free-flowing light-yellow crystalline powder as confirmed by $^{1}$H- and $^{119}$Sn-NMR collected on a $C_6D_6$ solution that is consistent with the previous report of this molecule. The filter cake was extracted with tetrahydrofuran (2×150 mL) until the filtrate was colorless. The resulting dark reddish/brown solution was dried under reduced pressure to yield $LiSn(NMe_2)_3$ (127.9 g, 0.62 moles) as an off-white solid and the major isolated product. $^{1}$H-NMR ($d_8$-THF, 400 MHz); s, 18H, 2.57 ppm; $^{7}$Li-NMR ($d_8$-THF, 155 MHz); 2.99 ppm; $^{13}$C-NMR ($d_8$-THF, 100 MHz); 44.68 ppm; $^{119}$Sn-NMR ($d_8$-THF, 150 MHz); 57.10 ppm.

Example 3 Synthesis of dimethylamido-isopropoxide Tin(II)

In a nitrogen-filled glovebox, $[Sn(N(CH_3)_2)_2]_2$ (3.0 g, 7.21 mmol) was loaded into a 40 mL vial equipped with a magnetic stir bar and diluted with hexanes (9 mL) to form a slightly cloudy yellow mixture. Separately, isopropanol ($HO^iPr$) (0.865 g, 14.4 mmol) was diluted with hexanes (6 mL) and the resulting solution added to the $[Sn(N(CH_3)_2)_2]_2$ solution dropwise over the course of 2 minutes. Gradually, the reaction presented as a pale-yellow solution and after stirring for ten minutes the volatiles were removed under reduced pressure to yield a light-yellow liquid. The product was loaded into a 50 mL flask equipped with a magnetic stir bar, whereby a short-path distillation head was attached along with a 10 mL collection flask, and the apparatus positioned into a heating mantle and placed under dynamic vacuum. The product was distilled over as a pale-yellow liquid at a head temperature of 67° C. and a system pressure of 1.62 Torr. The product was isolated as a slightly yellow liquid (mass: 1.90 g. yield: 59%). $^{1}$H-NMR ($C_6D_6$, 400 MHz); d, 6H, 1.31 ppm; s, 6H, 2.44 ppm; sept, 1H, 4.42 ppm; $^{119}$Sn-NMR ($C_6D_6$, 150 MHz); 31.83 ppm.

Example 4 Synthesis of dimethylamido-tert-butoxide Tin(II)

In a nitrogen-filled glovebox, $[Sn(N(CH_3)_2)_2]_2$ (5 g, 12.0 mmol) was loaded into a 40 mL vial equipped with a magnetic stir bar and diluted with hexanes (10 mL) to form a slightly cloudy yellow mixture. In a separate vial, tert-butanol (HO$^t$Bu) (1.77 g, 23.9 mmol) was dissolved in hexanes (5 mL) and added to the $[Sn(N(CH_3)_2)_2]_2$ mixture dropwise with stirring with effervescence observed upon alcohol addition. Upon complete addition the reaction presented as a colorless solution and was stirred at RT for 1 hour, at which point the volatiles were removed under reduced pressure to yield a pale-yellow liquid. The product was distilled in a nitrogen-filled glovebox similar to the procedure reported for dimethylamido-isopropoxide Tin (II) with a heat temperature range of 73-77° C. and system pressure of 1.82-1.75 Torr. The product was isolated as a pale-yellow liquid (mass: 3.2 g, yield: 57%). $^1$H-NMR ($C_6D_6$, 400 MHz); d, 9H, 1.38 ppm; s, 6H, 2.44 ppm; $^{119}$Sn-NMR ($C_6D_6$, 150 MHz); 31.77 ppm.

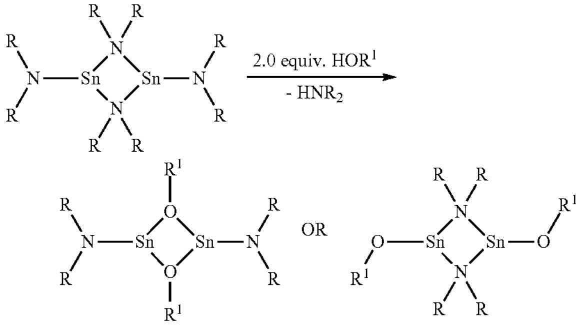

$[R^1OSn(NR_2)]_n$

| Compound | Boiling Point | Melting Point (by DSC) | Physical State at room temperature | $T_{50}$ (° C.) | Residual Mass (%) |
|---|---|---|---|---|---|
| 1* | 73° C. (1.82 Torr) | | Liquid | 170 | 0.40 |
| 2 | 67° C. (1.62 Torr) | | Liquid | 161.3 | 0.37 |
| 3 | | | Liquid | 197.2 | 3.09 |
| 4 | | 100.2 | Solid | 162.7 | 19.38 |

*Legend (Compound Nos.):
1. Sn(O-t-butyl)($N(CH_3)_2$)
2. Sn(O-isopropyl)($N(CH_3)_2$)
3. Sn(O-neopentyl)($N(CH_3)_2$)
4. $[Sn(N(CH_3)_2)_2]_2$

ASPECTS

In a first aspect, the invention provides a precursor composition comprising at least one compound chosen from Formulae (I), (II), and (III):

(I)

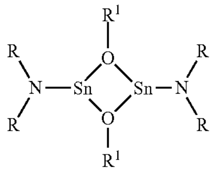

-continued (II)

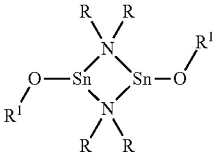

(III)

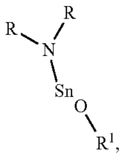

wherein R is $C_1$-$C_4$ alkyl and $R^1$ is $C_1$-$C_5$ alkyl.

In a second aspect, the invention provides the composition of the first aspect, wherein the composition contains no more than 100 ppm of materials which are other than compounds of Formulae (I), (II), and (III).

In a third aspect, the invention provides the precursor composition of the first or second aspect, wherein R is methyl, and $R^1$ is chosen from methyl, ethyl, isopropyl, t-butyl, and neopentyl.

In a fourth aspect, the invention provides the composition of the first second or third aspect, comprising at least one compound of Formula (III)

(III)

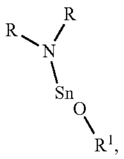

wherein R is methyl and $R^1$ is chosen from methyl, ethyl, isopropyl, t-butyl, and neopentyl.

In a fifth aspect, the invention provides the precursor composition of the first or fourth aspect, wherein R is methyl and $R^1$ is methyl.

In a sixth aspect, the invention provides the precursor composition of the first or fourth aspect, wherein R is methyl and $R^1$ is ethyl.

In a seventh aspect, the invention provides the precursor composition of the first or fourth aspect, wherein R is methyl and $R^1$ is isopropyl.

In an eighth aspect, the invention provides the precursor composition of the first or fourth aspect, wherein R is methyl and $R^1$ is neopentyl.

In a ninth aspect, the invention provides the precursor composition of the first or fourth aspect, wherein R is methyl and $R^1$ is tert-butyl.

In a tenth aspect, the invention provides the precursor composition of the first aspect, wherein the composition comprises a compound of Formula (I).

In an eleventh aspect, the invention provides the precursor composition of claim 1, wherein the composition comprises a compound of Formula (II).

In a twelfth aspect, the invention provides a process for preparing compounds of the Formulae (I), (II), and (III):

(I)

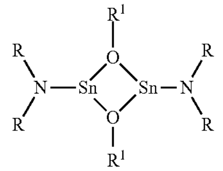

(II)

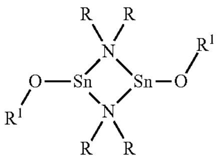

(III)

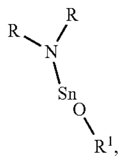

wherein R is $C_1$-$C_4$ alkyl and $R^1$ is $C_1$-$C_5$ alkyl;

which comprises contacting a compound of Formula(A):

(A)

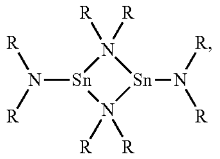

with a compound of the formula $HOR^1$, wherein the compound of the formula $HOR^1$ is present in an amount of about 0.8 to about 1.2 mole equivalents, based on the total moles of the compound of formula (A).

In a thirteenth aspect, the invention provides a precursor composition comprising a compound of Formula (A):

(A)

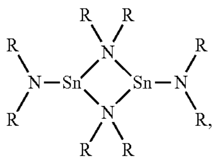

wherein each R is independently chosen from $C_1$-$C_4$ alkyl.

In a fourteenth aspect, the invention provides the precursor composition of the thirteenth aspect, wherein the composition has less than about 1 weight percent impurities.

In a fifteenth aspect, the invention provides a process for preparing compounds of the Formulae (I), (II), and (III):

(I)

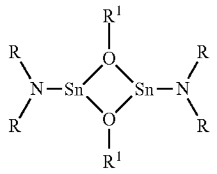

(II)

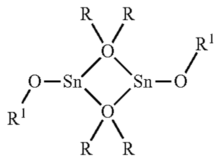

(III)

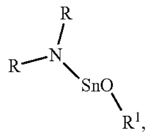

wherein R is $C_1$-$C_4$ alkyl and $R^1$ is $C_1$-$C_5$ alkyl;

which comprises contacting a compound of Formula(A):

(A)

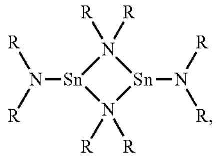

with a compound of the formula $HOR^1$, wherein the compound of the formula $HOR^1$ is present in an amount of about 3.8 to about 4.2 mole equivalents, based on the total moles of the compound of Formula (A).

In a sixteenth aspect, the invention provides a precursor composition comprising at least one compound chosen from formulae (IV), (V), and (VI):

(IV)

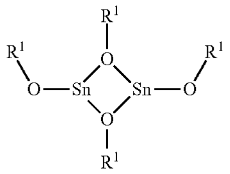

(V)

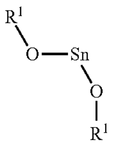

(VI)

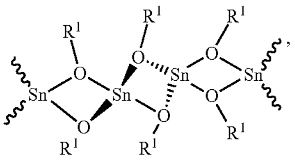

wherein R is $C_1$-$C_4$ alkyl and $R^1$ is $C_1$-$C_5$ alkyl, wherein the composition contains no more than 100 ppm of materials which are other than compounds of formulae (IV), (V), and (VI).

In a seventeenth aspect, the invention provides a process for preparing compounds chosen from Formulae (I), (II), and (III), (I)

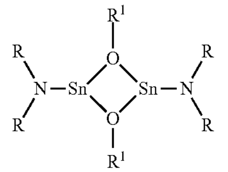

(II)

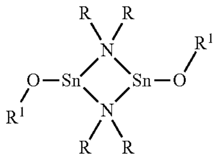

(III)

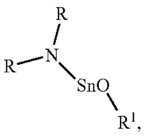

which comprises contacting a compound of the formula $SnX_2$, wherein X is chosen from chloro, bromo, or iodo, with approximately one molar equivalent of a compound of the formula $MN(R)_2$, and approximately one molar equivalent of a compound of the formula $MOR^1$, wherein M is chosen from groups 1 and 2 of the periodic table and $R^1$ is $C_1$-$C_4$ alkyl.

In an eighteenth aspect, the invention provides a process for preparing compounds chosen from (IV), (V), and (VI), (IV)

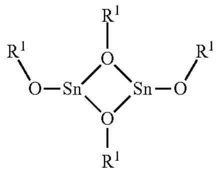

(V)

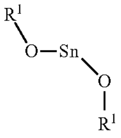

(VI)

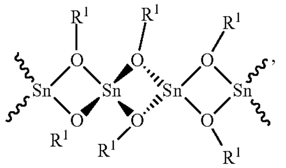

which comprises contacting a compound of the formula $SnX_2$, wherein X is chosen from chloro, bromo, or iodo, with approximately two molar equivalents of a compound of the formula $MN(R)_2$, and approximately 1.8 to about 2.2 molar equivalents of a compound of the formula $MOR^1$, wherein M is chosen from groups 1 and 2 of the periodic table and $R^1$ is $C_1$-$C_5$ alkyl.

In a nineteenth aspect, the invention provides a process for the deposition of a tin-containing film onto a surface of a microelectronic device in a reaction zone, which comprises introducing into the reaction zone, a precursor composition comprising at least one compound of Formula (A)

(A)

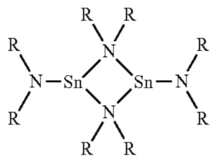

to the surface in a reaction zone under vapor deposition conditions.

In a twentieth aspect, the invention provides a process for depositing an EUV-patternable film onto a surface of a microelectronic device in a reaction zone, which comprises introducing into the reaction zone, reactants chosen from:

a. a precursor composition chosen from at least one compound of the Formulae (I) through (VI) and (A), as claimed in any one of the first through eleventh, the thirteenth, and the sixteenth aspects; and
b. at least one counter-reactant chosen from compounds capable of reacting with reacting with —O—$R^1$ and —$N(R)_2$ moieties, wherein $R^1$ is chosen from $C_1$-$C_5$ alkyl, and R is $C_1$-$C_4$ alkyl, under vapor deposition conditions.

In a twenty-first aspect, the invention provides the process of the twentieth aspect, wherein the vapor deposition conditions comprise chemical vapor deposition.

In a twenty-second aspect, the invention provides the process of the twentieth aspect, wherein the vapor deposition conditions comprise atomic layer deposition.

In a twenty-third aspect, the invention provides the process of the twentieth, twenty-first, or twenty-second aspects, wherein R is methyl, and $R^1$ is chosen from methyl, ethyl, isopropyl, t-butyl, and neopentyl.

In a twenty-fourth aspect, the invention provides the process of any one of the twentieth through the twenty-third aspects, wherein the counter-reactant(s) are chosen from water, peroxides, di- or polyhydroxy alcohols, hydrogen sulfide, hydrogen disulfide, trifluoroacetaldehyde monohydrate, fluorinated di- or polyhydroxy alcohols, and fluorinated glycols.

In a twenty-fifth aspect, the invention provides a microelectronic device substrate having deposited thereon an EUV-patternable film, the film formed by the process of any one of the twentieth through the twenty-fourth aspects.

In a twenty-sixth aspect, the invention provides the substrate of the twenty-fifth aspect, wherein the precursor composition comprises at least one compound chosen from Formulae (I), (II), and (III) as claimed in any one of the first through the eleventh aspects.

In a twenty-seventh aspect, the invention provides a kit, in one or more containers, one or more components chosen from:

a. a precursor composition comprising at least one compound of the formulae (I) through (VI) and (A), as claimed in any one of the first through eleventh, the thirteenth, or sixteenth aspects; and b. at least one counter-reactant chosen from compounds capable of reacting with —O—$R^1$ and —$N(R)_2$ moieties, wherein $R^1$ is chosen from $C_1$-$C_5$ alkyl, and R is $C_1$-$C_4$ alkyl.

In a twenty-eighth aspect, the invention provides the kit of the twenty-sixth aspect, wherein the counter-reactant is chosen from water, peroxides, di- or polyhydroxy alcohols, hydrogen sulfide, hydrogen disulfide, trifluoroacetaldehyde monohydrate, fluorinated di- or polyhydroxy alcohols, and fluorinated glycols.

In a twenty-ninth aspect, the invention provides the kit of the twenty-seventh or twenty-eighth aspect, wherein the precursor composition comprises at least one compound chosen from Formulae (I), (II), and (III), and (A), as claimed in any one of the first through eleventh, or thirteenth or fourteenth aspects.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respects, only illustrative. The disclosure's scope is, of course, defined in the language in which the appended claims are expressed.

What is claimed is:

1. A precursor composition comprising a compound of Formula (III):

(III)

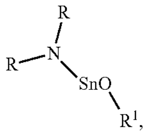

wherein R is $C_1$-$C_4$ alkyl and $R^1$ is $C_1$-$C_5$ alkyl.

2. The composition of claim 1, wherein the composition contains no more than 100 ppm of materials which are other than compounds of Formulae (I), (II), and (III), wherein Formulae (I) and (II) are:

(I)

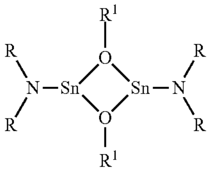

-continued (II)

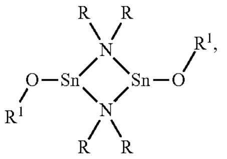

wherein R is $C_1$-$C_4$ alkyl and $R^1$ is $C_1$-$C_5$ alkyl.

3. The precursor composition of claim 1, wherein R is methyl, and $R^1$ is chosen from methyl, ethyl, isopropyl, t-butyl, and neopentyl.

4. The precursor composition of claim 1, wherein R is methyl and $R^1$ is methyl.

5. The precursor composition of claim 1, wherein R is methyl and $R^1$ is ethyl.

6. The precursor composition of claim 1, wherein R is methyl and $R^1$ is isopropyl.

7. The precursor composition of claim 1, wherein R is methyl and $R^1$ is neopentyl.

8. The precursor composition of claim 1, wherein R is methyl and $R^1$ is tert-butyl.

9. The precursor composition of claim 1, wherein the composition further comprises a compound of Formula (I), (I)

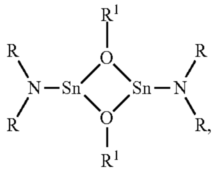

wherein R is $C_1$-$C_4$ alkyl and $R^1$ is $C_1$-$C_5$ alkyl.

10. The precursor composition of claim 1, wherein the composition further comprises a compound of Formula (II), (II)

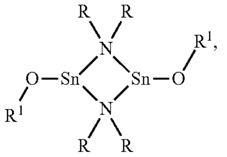

wherein R is $C_1$-$C_4$ alkyl and $R^1$ is $C_1$-$C_5$ alkyl.

* * * * *